(12) United States Patent
Bhartia et al.

(10) Patent No.: US 9,858,128 B2
(45) Date of Patent: *Jan. 2, 2018

(54) ROBUST AND ADAPTABLE MANAGEMENT OF EVENT COUNTERS

(71) Applicant: International Business Machines Corporation, Armonk, NY (US)

(72) Inventors: Jatin Bhartia, Uttar Pradesh (IN); Matthias D. Heizmann, Poughkeepsie, NY (US); Ajit S. Honnungar, Poughkeepsie, NY (US); Parminder Singh, Karnataka (IN)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 58 days.

This patent is subject to a terminal disclaimer.

(21) Appl. No.: 15/073,173

(22) Filed: Mar. 17, 2016

(65) Prior Publication Data
US 2017/0004024 A1    Jan. 5, 2017

Related U.S. Application Data

(63) Continuation of application No. 14/789,402, filed on Jul. 1, 2015.

(51) Int. Cl.
*G06F 17/50* (2006.01)
*G06F 9/54* (2006.01)
(Continued)

(52) U.S. Cl.
CPC .......... *G06F 9/542* (2013.01); *G06F 11/2289* (2013.01); *G06F 11/273* (2013.01); *G06F 11/3024* (2013.01); *G06F 11/3447* (2013.01); *G06F 11/3495* (2013.01); *G06F 17/5022* (2013.01); *G06F 17/5081* (2013.01); *G06F 17/504* (2013.01); *G06F 17/505* (2013.01)

(58) Field of Classification Search
CPC ............ G06F 17/5081; G06F 17/5022; G06F 17/504; G06F 17/505
USPC ........... 716/111, 106, 104, 132, 136; 703/16
See application file for complete search history.

(56) References Cited

U.S. PATENT DOCUMENTS 4,868,825 A * 9/1989 Koeppe ................. G06F 11/261
                                                  703/14
5,151,981 A * 9/1992 Westcott ............. G06F 11/3466
                                                  714/47.2
(Continued)

*Primary Examiner* — Phallaka Kik
(74) *Attorney, Agent, or Firm* — Cantor Colburn LLP; William A. Kinnaman, Jr.

(57) ABSTRACT

Embodiments include a method for verifying a counter design within a tolerance window within which a race condition occurs between a context event and a design event. The method includes receiving a plurality of events within the counter design, the plurality of events including the context event and the design event. The method also includes dynamically determining the tolerance window around the context event by setting a first portion of the tolerance window to precede an occurrence of the context event and by setting a second portion of the tolerance window to follow the context event. Additionally, the method includes performing a verification of whether the design event is within the first portion of the tolerance window or the second portion of the tolerance window.

1 Claim, 5 Drawing Sheets

(51) Int. Cl.
   *G06F 11/34* (2006.01)
   *G06F 11/30* (2006.01)
   *G06F 11/22* (2006.01)
   *G06F 11/273* (2006.01)

(56) References Cited

U.S. PATENT DOCUMENTS

| | | | |
|---|---|---|---|
| 6,807,583 B2 | 10/2004 | Hrischuk et al. | |
| 7,085,703 B2 | 8/2006 | Gabele et al. | |
| 7,461,383 B2* | 12/2008 | Gara | G06F 11/348 377/26 |
| 7,523,359 B2* | 4/2009 | Richards | G06F 11/076 714/49 |
| 9,684,550 B2* | 6/2017 | Bhartia | G06F 9/542 |
| 9,697,147 B2* | 7/2017 | Loh | G06F 13/1668 |
| 2008/0170046 A1* | 7/2008 | Rimon | G06F 3/044 345/174 |
| 2008/0282067 A1* | 11/2008 | Ozer | G06F 9/4881 712/214 |
| 2010/0299470 A1* | 11/2010 | Uno | G06F 9/4812 710/260 |
| 2012/0007834 A1* | 1/2012 | Chen | G06F 3/042 345/175 |
| 2012/0072920 A1* | 3/2012 | Kawamura | G06F 9/30123 718/108 |
| 2013/0163032 A1* | 6/2013 | Hamano | G06F 3/1296 358/1.14 |
| 2014/0013020 A1* | 1/2014 | Horsnell | G06F 13/24 710/260 |
| 2014/0040698 A1* | 2/2014 | Loh | G06F 13/1668 714/758 |
| 2015/0363596 A1* | 12/2015 | DeCesaris | G06F 21/554 726/23 |
| 2017/0004023 A1* | 1/2017 | Bhartia | G06F 9/542 |
| 2017/0004024 A1* | 1/2017 | Bhartia | G06F 9/542 |
| 2017/0004061 A1* | 1/2017 | Bhartia | G06F 9/542 |

* cited by examiner

ROBUST AND ADAPTABLE MANAGEMENT OF EVENT COUNTERS

CROSS-REFERENCE TO RELATED APPLICATION

This application is a continuation of U.S. application Ser. No. 14/789,402, filed on Jul. 1, 2015, the disclosure of which is incorporated by reference herein in its entirety.

BACKGROUND

The present disclosure relates generally to management of event counters, and more specifically, to a robust and adaptable management scheme for verifying event counters during a race condition between design and context events.

In general, a context event can be defined as any event that changes the behavior of a counter, while a design event can be defined as any event accumulated in the counter. For example, a context event may be a control register update that modifies an event qualification condition or an exception event that clears the speculative path and restarts an execution from a previous check pointed state, thus impacting accountability of design events in a speculative path.

Verification of counter designs usually requires a reference model and a scoreboard kind of mechanism that compares counter values with that of the reference model. In case of context events, reference models either don't model context changes or closely imitate the counter design for cycle accuracy. There are inherent flaws in both schemes. In the former approach, there is no checking being done in a window where the context changes and the test-bench have to be synchronized with the counter design after the context switch has happened. The latter approach is very time consuming, as it requires a deep understanding of the micro-architectural implementation and it is also high on maintenance due to vulnerability to micro-arch changes. Further, the latter approach also has another disadvantage of not using a high level architecture level specification, but relying on the designers understanding of the architecture. This makes the latter approach susceptible to duplicating design mistakes (if any).

SUMMARY

Embodiments include a method for verifying a counter design within a tolerance window within which a race condition occurs between a context event and a design event. The method includes receiving a plurality of events within the counter design, the plurality of events including the context event and the design event. The method also includes dynamically determining the tolerance window around the context event by setting a first portion of the tolerance window to precede an occurrence of the context event and by setting a second portion of the tolerance window to follow the context event. Additionally, the method includes performing a verification. The verification includes determining whether the design event is within the first portion of the tolerance window, and when the design event is within the second portion of the tolerance window, qualifying the design event with a current context and recording the design event in a reference model counter. The verification also includes determining whether the design event is within the second portion of the tolerance window, and when the design event is within the second portion of the tolerance window, qualifying the design event with a pre- vious context and a next context, wherein the next context is a result of the context event.

Additional features and advantages are realized through the techniques of the present disclosure. Other embodiments and aspects of the disclosure are described in detail herein. For a better understanding of the disclosure with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Embodiments described herein relate to a robust and adaptable management scheme for verifying counters of counter designs during a race condition between design and context events. Embodiments can perform the verification in less time than present approaches and with a higher architectural accuracy. By verifying the counter designs in this way, the embodiments described herein can make hardware implementation details transparent.

In general, counter designs are implemented in hardware designs for various design points like counting a plurality of simple tracing/performance events (e.g., design events) to implementing complicated state machines that trigger certain control events when a count reaches a pre-determined state (e.g., context events). Counter designs further include counters.

A counter is a device that can store a number of times an event or a process has occurred, often in relationship to a clock signal. For example, a design event is any event whose occurrence is accumulated in a counter based on the programming of a control register. A behavior of a counter may also be affected by an event or a process. For example, a context event is any event that alters a behavior of a counter (e.g., a reset event, or event that defines a mode of operation).

Figure 1:
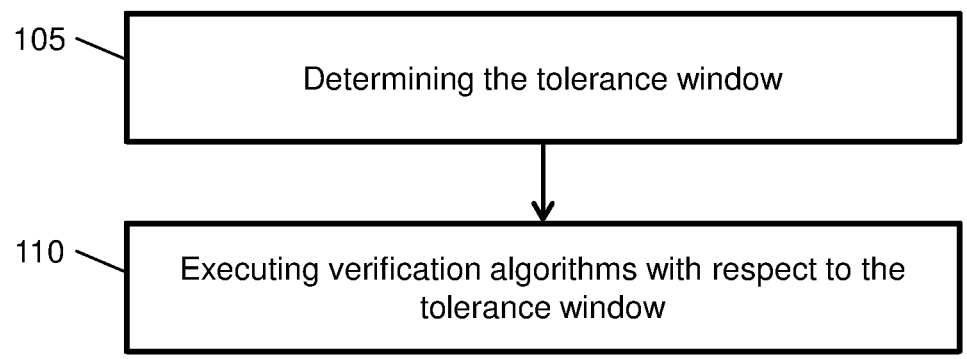
FIG. 1 depicts a process flow performed by a testing scheme in accordance with an embodiment.

If a context event occurs close to a design event that is being counted, a possible race condition might occur. As used herein, the term "race condition" refers to when a device or system attempts to perform two or more operations at the same time and the results are dependent on the order of the events and the order itself is not guaranteed (e.g., when a context event occurs close to a design event that is being counted). Embodiments described herein disclose a testing scheme for verifying counter designs by checking and evaluating all possible combinations with respect to race conditions. Turning now to FIG. 1, a process flow 100 performed by the testing scheme is generally shown in accordance with an embodiment. The process flow 100 in general validates counters within a race window (e.g., 'tolerance window') by checking that the counter design allows events to succeed or not and that the counter design is not incoherent with architectural rules.

The testing scheme, at block 105 of the process flow 100, determines a width of a tolerance window. A tolerance window can be a situation a window where possible race conditions happen between context events and design events (note that, outside the tolerance window, usually a reference counter follows a design counter accurately). The tolerance window is defined around a context event. In this way, it is not possible to dynamically determine a start of the tolerance window until the context event has occurred. The tolerance window, in turn, includes a time window TA before the occurrence of the context event and a time window TB after the context event, such that TA plus TB equals the complete tolerance window T, where T, TA, and TB can be measured in time-units (e.g., that represent a minimal measurable duration in the simulation) or can be measured in terms of number of clock cycles for synchronous designs. In the following description, T, TA and TB are considered to be measured in terms of number of clock cycles for ease of representation. In one example, the width of tolerance window is determined by the test scheme based on the following logic:

$T_{EffEventDelay} = x_{max} =$ maximum path delay of any event that can be counted by the counter $T_{EffContextDelay} = y_{max} =$ maximum path delay of any context switch that effect the counter behavior Now, if $(T_{EffEventDelay} >= T_{EffContextDelay})$, then
TA Start Time $= T_{ContextEvent} - (T_{EffEventDelay} - T_{EffContextDelay})$
TA End Time $= T_{ContextEvent}$
TB Start Time $= T_{ContextEvent}$
TB End Time $= T_{ContextEvent} + T_{EffContextDelay}$
But if $(T_{EffEventDelay} < T_{EffContextDelay})$ then TA doesn't exist and T=TB
TB Start Time $= T_{ContextEvent}$
TB End Time $= T_{ContextEvent} + T_{EffContextDelay}$ In case of an unknown maximum path delay, the time windows TA and TB can also be determined using iterative experiments where, TA and TB are initially assumed to be zero, and then iteratively increased in value until a passing condition is found. This iterative method only needs to be done once when setting up an environment of the counter design.

Next, at block 110, the testing scheme executes verification algorithms with respect to the tolerance window. The verification algorithms are further described with respect to FIGS. 2-3.

Figure 2:
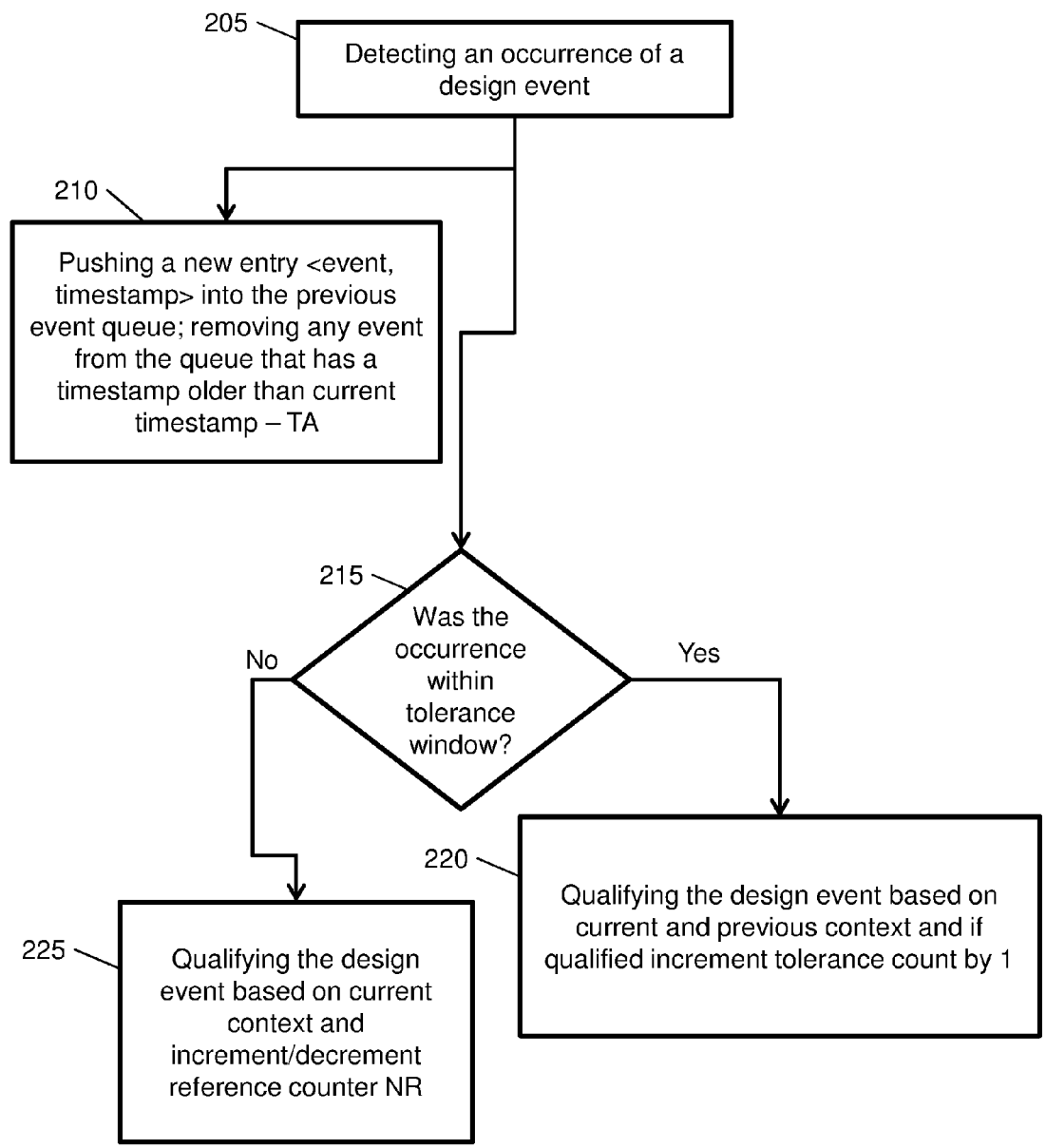
FIG. 2 depicts a process flow performed by a testing scheme in accordance with an embodiment.

Turning now to FIG. 2, a process flow 200 for a verification algorithm is generally shown in accordance with an embodiment. Process flow 200 begins at block 205 where the testing scheme detects an occurrence of design events in the current timestamp, where timestamps for example refers to current clock cycle of the simulation.

Next, at block 210, the verification algorithm maintains a history of all the design events that happened in the last time slice that may correspond to the time window TA (e.g., events EA). Note that the time window TA is unknown at this point. For example, the testing scheme, on detection of a new design events can push a new entry <event, timestamp> per design event into a previous event queue, where entry represents the design event along with its attributes and timestamp represents the clock cycle number when the event occurred on the boundary of the design. To maintain a history of design events that had occurred in last time slice that may correspond to the time window TA, the testing scheme can, for example, further remove any event from this previous event queue that has a timestamp older than a current timestamp minus the total of the effective event delay minus the effective context delay (which will equal the width of the time window TA).

Then, at decision block 215, the testing scheme checks whether the detected occurrence of set of design event have happened within the time window TB (i.e., after the context event). Note that the detection of time window TB is defined below in process flow 300.

Thus, if the detected set of events occurred within the time window TB portion of tolerance window T (e.g., events EB), then the process flow 200 proceeds via the 'Yes' arrow to block 220 where the events EB are qualified with the older context and new context that was a result of the context event triggered the start of time window TB. The set of events EB that get qualified by the previous context can be referred to as EB0 and the set of events EB that get qualified by the new context can be referred to as EB1. Further, the testing scheme can 'increment (for up counter)/decrement (for down counter)' the reference model counter NR for each EB event that qualifies with both newer and older context, i.e., NR+=n(EB0∩EB1) (for up counter). The testing scheme can also increment reference model tolerance counter NC for each EB event that gets qualified with either of the context but not both the contexts, i.e., NC+=(n(EB0∪EB1)−n(EB0∩EB1)) (for up counter). Note that the design events occurring in the tolerance window can have one of three outcomes: 1) the event is guaranteed to be accumulated in the design counter; 2) the event can possibly be accumulated; and 3) the event is ignored and not accumulated in the counter. The reference model counter NR accumulates the events with first outcome, i.e., all the events that are guaranteed to be accumulated. The reference model tolerance counter NC represents the second outcome, i.e., all the events within the tolerance window that can possibly be accumulated by the design counter ND, while the reference model filters out the third outcome which ensures that design ND never accumulate the events that doesn't get qualified with either of the contexts.

Further, if the detected set of events occurred outside the time window TB, then the process flow 200 proceeds via the 'No' arrow to block 225 where the set of events are qualified with the current context and the reference model counter NR is 'incremented (for up counter)/decremented (for down counter)' for each qualified event.

Figure 3:
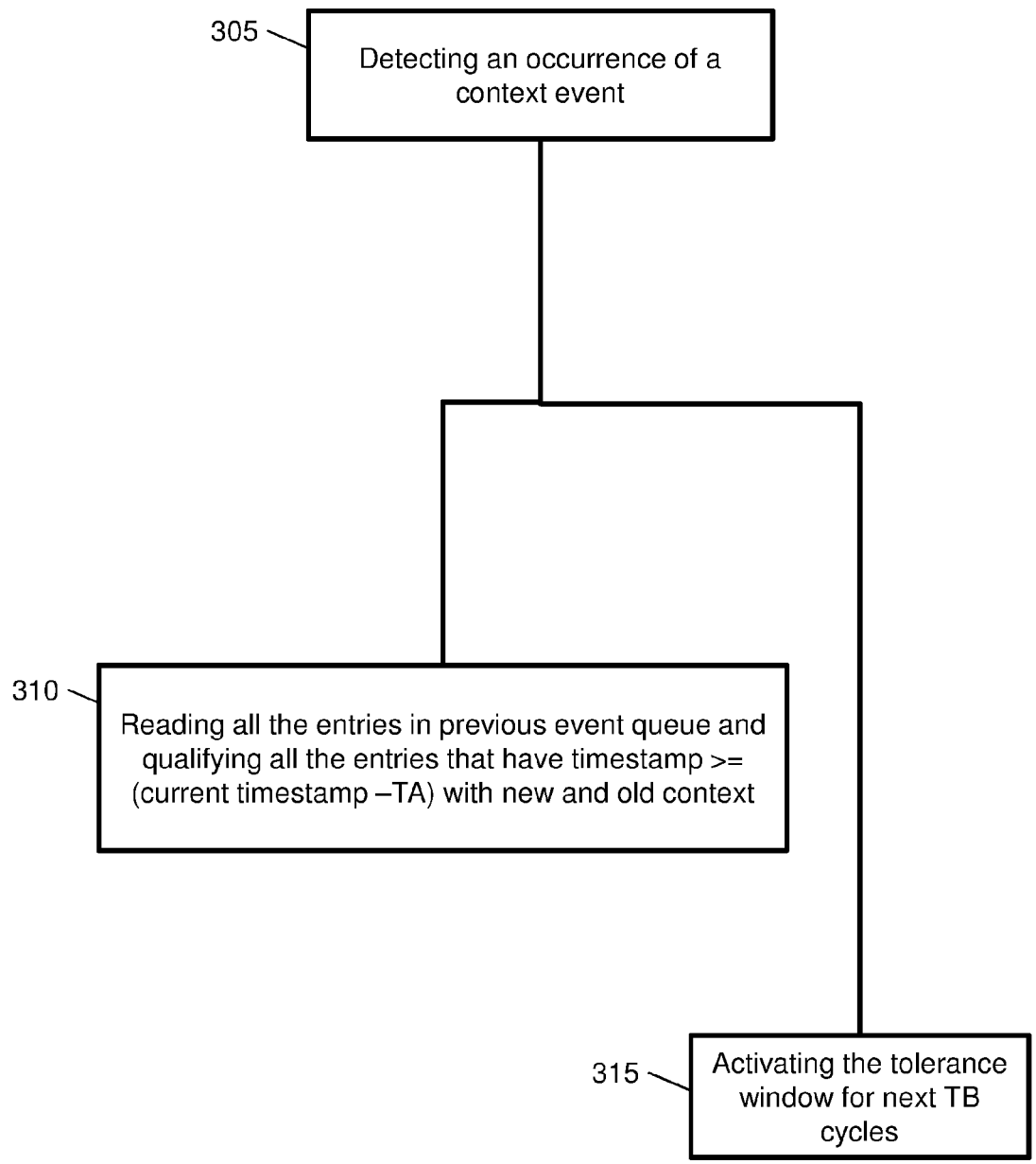
FIG. 3 depicts a process flow performed by a testing scheme in accordance with an embodiment.

Turning now to FIG. 3, a process flow 300 for a verification algorithm is generally shown in accordance with an embodiment. Process flow 300 begins at block 305 where the testing scheme detects an occurrence of a context event. In response to detecting a context event, the process flow 300 proceeds to block 310 where the testing scheme reads all the entries in previous event queue (i.e., events EA) and qualifies all the entries that have timestamp>=(current timestamp−TA) with new and old context. The events EA that get qualified with the older context can be represented as EA0 and the events EA that get qualified with the newer context are can be represented as EA1. Further, the testing scheme 'increments (for up counter)/decrements (for down counter)' the reference model tolerance count NC for every event EA that got qualified in either of the new and old contexts but not all the context. In this way, for each event that qualifies, NC+=(n(EA0∪EA1)−n(EA0∩EA1)) (for up counter). Further, reference model counter NR is adjusted such that it only accumulates the events EA that get qualified with both the contexts, i.e., NR−=(n(EA0)−n(EA0∩EA1)) (for up counter). Additionally, in response to detecting a context event, the testing scheme at block 315 activates the tolerance window for next TB cycles, which is used in block 215.

In view of the above, the set of design events are accumulated by a design model counter ND. Note that the design model counter ND is being verified by the verification algorithms of the testing scheme. This testing scheme in summary qualifies set of events (EA/EB) in a tolerance window TA/TB with both older context and with newer context. Further, the testing scheme utilizes a reference model tolerance counter NC in the tolerance window TA/TB and a reference model counter NR to verify the design counter ND by performing the logic of: NC=(n(EA0∪EA1)−n(EA0∩EA1))+(n(EB0∪EB1)−n(EB0∩EB1)), which is a tolerance count, and NR=non tolerance count+n(EA0∩EA1))+n(EB0∩EB1)), which is a reference count. This logic follows a set of two rules that always hold true for all the design up counters: ND>=NR and ND−NR<=NC.

Figure 4:
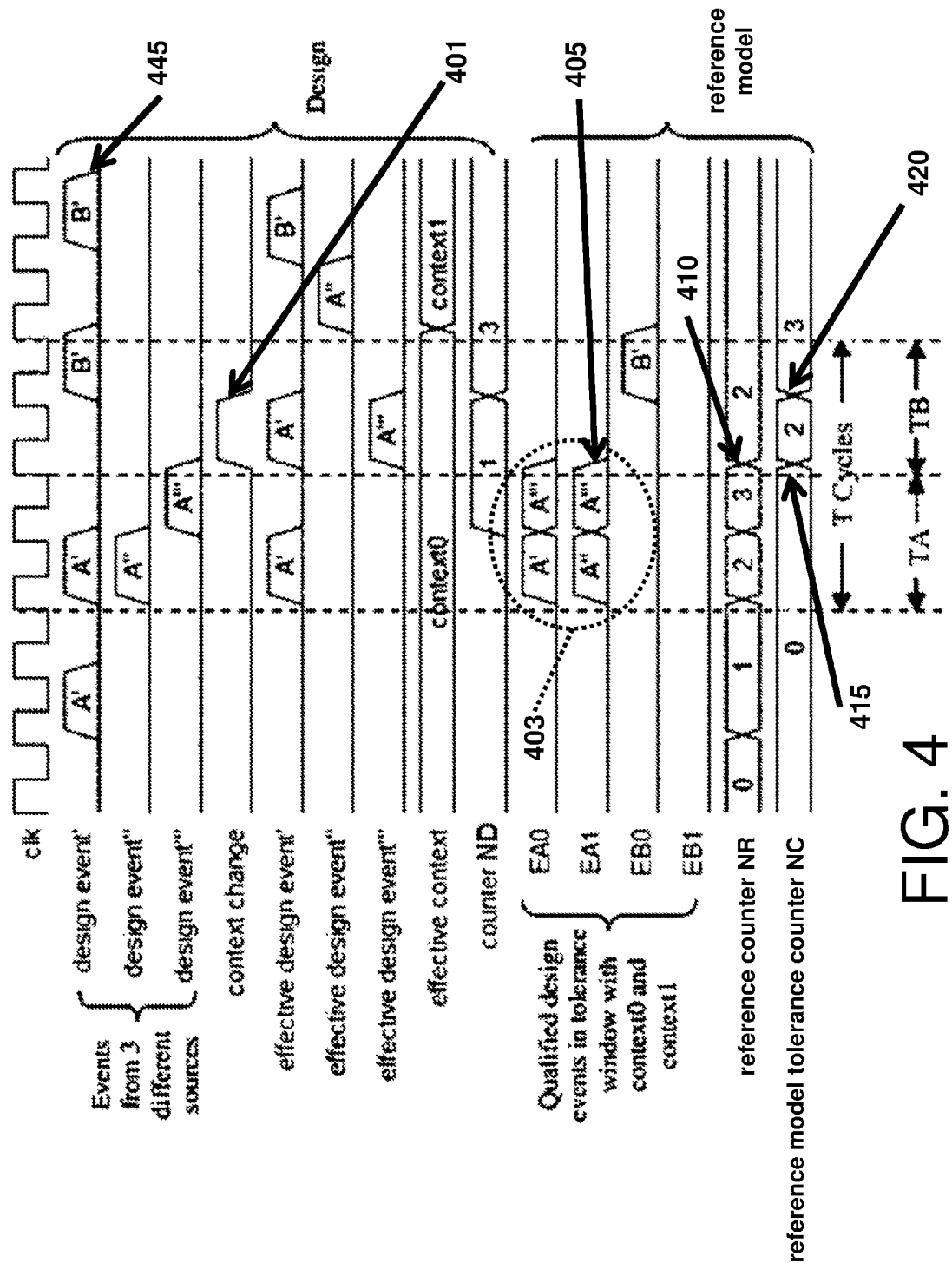
FIG. 4 depicts an example of a set of signals processed by a testing scheme in accordance with an embodiment.

Turning now to FIG. 4, an example of a set of signals processed by a testing scheme in accordance with an embodiment is illustrated. Consider a design under test that has three source of events (with different path delays) designated by design event', design event", and design event'" and two contexts designated by context0 and contex1, which alternate based on the context change event. For example, see the line designation 'effective context' that illustrates the change in context between context0 and contect1 are based on the context change event 401. In this way, the design event' has a fixed path delay of 2 cycles and is qualified by context0; the design event' has a fixed path delay of 4 cycles and is qualified by context1; the design event'" has a fixed path delay of 1 cycle and is qualified by both the context0 and context1; and the context change event, which is indicated by demarcation 401, has a fixed delay of 2 cycles.

At demarcation 403, three design events are qualified in the tolerance window T (e.g., time window TA). Further, at demarcation 405, A'" is getting qualified with both context0 and context1, so both EA0 and EA1 have A'" as a qualified event. At demarcation 410, the logic follows that the reference counter NR−=(n(EA0)−n(EA0∩EA1)) where n(EA0)=n{A', A'"}=2, n(EA1)=n{A", A'"}=2, n(EA0∩EA1)=n{A'"}=1. In this way, NR=3−(2−1)=2.

At demarcation 415, the logic follows that the reference model tolerance counter NC=(n(EA0∪EA1)−n(EA0∩EA1))+(n(EB0∪EB1)−n(EB0∩EB1)), where n(EA0∪EA1)=3, n(EA0∩EA1))=1, n(EB0∪EB1)=0, and n(EB0∩EB1)=0 in this cycle. Thus, the reference model tolerance counter NC=2 at this cycle.

At demarcation 420, B' is getting qualified with context 0, so n(EB0)=n{B'}=1 and is getting accounted in the reference model tolerance counter NC. Note that any events not qualified are ignored by the design and reference counters (see demarcation 445).

Embodiments describes above can be extended for cases where there are race conditions between multiple context events. In such case, a tolerance window has to be redefined such that it envelops each individual time window. That is, a super tolerance window is generated by elongating the tolerance windows surrounding the multiple context events. For example, if two context events (context-x and context-y) occur, a super tolerance window redefined into three windows: a first time window TA of TAx-TBx that doesn't overlap with a TAy-TBy, a second time window of TAx-TBx that overlaps with TAy-TBy, and a third time window TC of TAy-TBy that doesn't overlap with any TAx-TBx. Further, EA is a set of events that happened in the time window TA, EB is a set of events that happened in the time window TB, and EC is a set of events that happened in time window TC.

Events that are evaluated in all four possible contexts in the super tolerance window where context-0 is an original context before occurring of context event x, where context-1 is context-0+context-x, context-2 is context-0+context-y, context-3 is context-0+context-x+context-y. Further, the qualified events may include EA0 and EA1, which are qualified EA events with context-0 and context-1; EB0, EB1, EB2 and EB3, which are qualified EB Events with all the contexts; and EC1 and EC3, which are qualified EC events with context-1 and context-3.

In view of the above example, the following equation and rules must be used to determine the tolerance and reference counts: NR=NR−n(EA0)+n(EA0∩EA1))+n(EB0∩EB1∩EB2∩EB3)+n(EC1∩EC3); and NC=(n(EA0∪EA1)−n(EA0∩EA1))+(n(EB0∪EB1∪EB2∪EB3)−n(EB0∩EB1∩EB2∩EB3))+(n(EC1∪EC3)−n(EC1∩EC3)). This logic would still follow them same set of two rules that always hold true for all the design up counters: ND>=NR and ND−NR<=NC.

Figure 5:
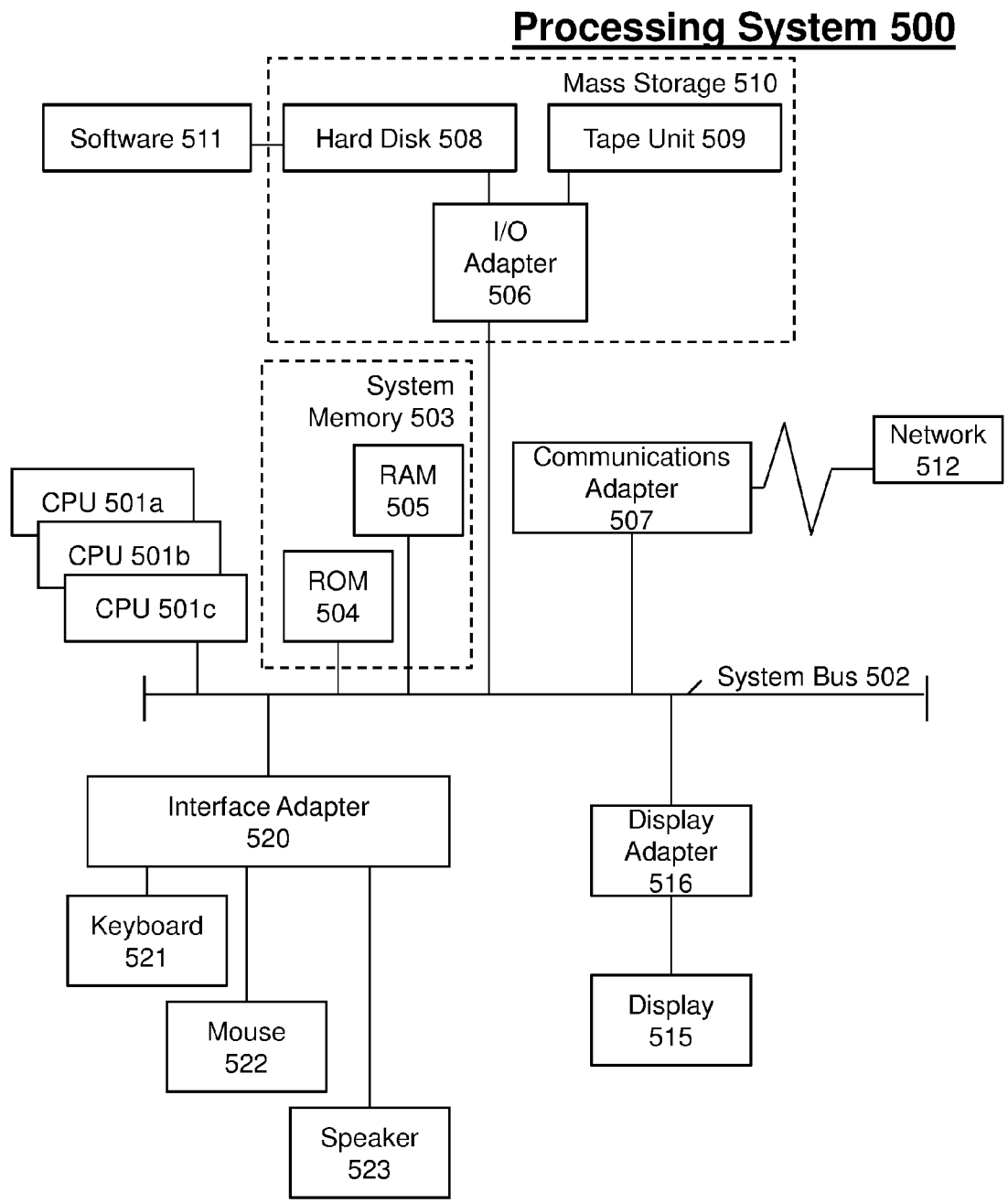
FIG. 5 depicts a processing system in accordance with an embodiment.

Referring now to FIG. 5, there is shown an embodiment of a processing system 500 for implementing the teachings herein. In this embodiment, the processing system 500 has one or more central processing units (processors) 501a, 501b, 501c, etc. (collectively or generically referred to as processor(s) 501). The processors 501, also referred to as processing circuits, are coupled via a system bus 502 to system memory 503 and various other components. The system memory 503 can include read only memory (ROM) 504 and random access memory (RAM) 505. The ROM 504 is coupled to system bus 502 and may include a basic input/output system (BIOS), which controls certain basic functions of the processing system 500. RAM is read-write memory coupled to system bus 502 for use by processors 501.

The processing system 500 further depicts an input/output (I/O) adapter 506 and a network adapter 507 coupled to the system bus 502. I/O adapter 506 may be a small computer system interface (SCSI) adapter that communicates with a hard disk 508 and/or tape storage drive 509 or any other similar component. I/O adapter 506, hard disk 508, and tape storage drive 509 are collectively referred to herein as mass storage 510. Software 511 for execution on processing system 500 may be stored in mass storage 510. The mass storage 510 is an example of a tangible storage medium readable by the processors 501, where the software 511 is stored as instructions for execution by the processors 501 to perform a method, such as the process flows of FIGS. 1-3. Network adapter 507 interconnects system bus 502 with an outside network 512 enabling processing system 500 to communicate with other such systems. A screen (e.g., a display monitor) 515 is connected to system bus 502 by display adapter 516, which may include a graphics controller to improve the performance of graphics intensive applications and a video controller. In one embodiment, adapters 506, 507, and 516 may be connected to one or more I/O buses that are connected to system bus 502 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 502 via an interface adapter 520 and the display adapter 516. A keyboard 521, mouse 522, and speaker 523 can be interconnected to system bus 502 via interface adapter 520, which may include, for example, a Super I/O chip integrating multiple device adapters into a single integrated circuit.

Thus, as configured in FIG. 5, processing system 505 includes processing capability in the form of processors 501, and, storage capability including system memory 503 and mass storage 510, input means such as keyboard 521 and mouse 522, and output capability including speaker 523 and display 515. In one embodiment, a portion of system memory 503 and mass storage 510 collectively store an operating system, such as the z/OS or AIX operating system from IBM Corporation, to coordinate the functions of the various components shown in FIG. 5.

Technical effects and benefits can include defining a tolerance window within which checking is done to ensure that a design allows an event to be captured or not and is coherent with architectural boundary. In this way, instead of monitoring each event from the design with cycle accuracy (i.e., which is tedious and prone to change as there is a tight link to design and context events), the technical effects and benefits further include utilizing a tolerance window defined based on certain inputs from the design and utilizing an algorithm that calculates and evaluates the events that happened within tolerance window. The technical effects and benefits can further improve accuracy of context switching counter verification within architecturally defined boundary.

Moreover, the technical effects and benefits can include a dynamic detection and width calculation of the tolerance window, filtering out ambiguities in the design implementation (within specification compliance) that must not be flagged as an error, and segregating events into 3 categories, which could be used for counter verification or any event occurrence verification. The three categories including events that are true with all the context switch happened in the given tolerance window, events that are not true with any of the contexts, and events that are true with at least one context but not all contexts. In this way, the technical effects and benefits include reducing the risks of going through multiple iterations of modeling reference model to match the implementation and also avoid repeating the same mistakes (if any) done by the designer.

Additionally, the technical effects and benefits can include a very robust and adaptable testing scheme that is easy to maintain and use, such that the testing scheme is 100% specification compliance (e.g., even if the specification has ambiguity that gives flexibility to the designer to implement micro-architecture, then verification should always be complaint to specification).

The present invention may be a system, a method, and/or a computer program product. The computer program product may include a computer readable storage medium (or media) having computer readable program instructions thereon for causing a processor to carry out aspects of the present invention. The computer readable storage medium can be a tangible device that can retain and store instructions for use by an instruction execution device.

The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions. The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for verifying a counter design within a tolerance window within which a race condition occurs between a context event and a design event, comprising:

receiving, by a processor, a plurality of events within the counter design, the plurality of events including the context event and the design event;

dynamically determining, by the processor, the tolerance window around the context event by setting a first portion of the tolerance window to precede an occurrence of the context event and by setting a second portion of the tolerance window to follow the context event; and executing, by the processor, a verification algorithm comprising:

determining whether the design event is within the first portion of the tolerance window, and when the design event is outside of the first portion of the tolerance window, qualifying the design event with a current context and recording the design event in a reference model counter, and determining whether the design event is within the second portion of the tolerance window, and when the design event is within the second portion of the tolerance window, qualifying the design event with a previous context and a next context, wherein the next context is a result of the context event.

* * * * *